United States Patent
Kim et al.

(10) Patent No.: US 7,796,427 B2
(45) Date of Patent: Sep. 14, 2010

(54) METHOD AND APPARATUS FOR WRITING DATA TO AND READING DATA FROM PHASE-CHANGE RANDOM ACCESS MEMORY

(75) Inventors: Jin-kyu Kim, Seoul (KR); Kyoung-il Bang, Suwon-si (KR); Hyung-gyu Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 202 days.

(21) Appl. No.: 12/231,239

(22) Filed: Aug. 29, 2008

(65) Prior Publication Data

US 2009/0094405 A1    Apr. 9, 2009

(30) Foreign Application Priority Data

Oct. 4, 2007    (KR) ............... 10-2007-0099881

(51) Int. Cl.
G11C 11/00    (2006.01)
(52) U.S. Cl. .................. 365/163; 365/158; 365/171; 365/173
(58) Field of Classification Search ............. 365/163, 365/158, 171, 173
See application file for complete search history.

(56) References Cited

U.S. PATENT DOCUMENTS

| | | | |
|---|---|---|---|
| 5,873,112 A | 2/1999 | Norman | |
| 6,965,533 B2 | 11/2005 | Sakata et al. | |
| 2002/0188798 A1 | 12/2002 | Kumaki et al. | |
| 2003/0009617 A1 * | 1/2003 | Cohen | ............ 711/105 |
| 2003/0081451 A1 | 5/2003 | Lowrey et al. | |
| 2003/0086302 A1 | 5/2003 | Kurakata et al. | |
| 2007/0217318 A1 | 9/2007 | Nirschl et al. | |
| 2008/0101131 A1 | 5/2008 | Lee et al. | |
| 2008/0219047 A1 * | 9/2008 | Yu et al. | ............ 365/163 |

FOREIGN PATENT DOCUMENTS

EP    0495494 A1    7/1992

* cited by examiner

*Primary Examiner*—Pho M Luu
(74) *Attorney, Agent, or Firm*—Mills & Onello, LLP

(57) ABSTRACT

A method and apparatus for writing data to and reading data from a phase-change random access memory (PRAM) include encoding original data using a predetermined encoding function, selecting data, from among the original data and the encoded data, which require less power when being written to the PRAM, writing the selected data to the PRAM, generating marking information related to the selected data, and writing the marking information to the PRAM. Therefore, power consumption can be reduced when data are written to the PRAM.

20 Claims, 5 Drawing Sheets

METHOD AND APPARATUS FOR WRITING DATA TO AND READING DATA FROM PHASE-CHANGE RANDOM ACCESS MEMORY

CROSS-REFERENCE TO RELATED PATENT APPLICATION

This application claims the benefit of Korean Patent Application No. 10-2007-0099881, filed on Oct. 4, 2007, in the Korean Intellectual Property Office, the contents of which are incorporated herein in their entirety by reference.

BACKGROUND OF THE INVENTION

1. Field of the Invention

The present invention relates to a method and apparatus for writing data to and reading data from a phase-change random access memory (PRAM), and more particularly, to a method and apparatus for reducing power consumption when data are written to a PRAM.

2. Description of the Related Art

Phase-change random access memories (PRAMs) are memory devices for storing data by using the phase change of a material. In a PRAM, a crystalline state and an amorphous state represent bit values '0' and '1', respectively. (The respective representations can be reversed, depending on a device design.) The phase change of a material can be induced by a temperature difference caused by the application of current, and an example of cell materials having such a property include germanium antimony telluride (GST or $Ge_2Sb_2Te_5$).

PRAMs have nonvolatile characteristics like NAND flash memories. However, PRAMs differ from NAND flash memories in that data can be accessed on a byte basis, and erasing is not necessary. Because of such characteristics, PRAMs are suitable for storage devices in mobile applications.

However, PRAMs consume considerable power during data programming and moreover, the power consumption of PRAMs varies according to a pattern of write data. For example, the power consumption for writing a data bit '1' (or '0') to a PRAM is greater than the power consumption for writing a data bit '0' (or '1') to the PRAM. Hereinafter, it is assumed that the power consumption for writing a data bit '1' to a PRAM is higher than the power consumption for writing a data bit '0' to the PRAM.

FIG. 1 contains a schematic block diagram of a conventional storage device.

Referring to FIG. 1, the conventional storage device includes a processor 110, a buffer memory 120, and a PRAM 130 that are interconnected by a system bus.

In general, the processor 110 receives write data, such as user data A, from the buffer memory 120, such as a dynamic random access memory (DRAM), and writes the user data A to a particular area of the PRAM 130. The processor 110 can add meta-data to the user data A in order to control and receive the user data A. However, in general, the processor 110 writes the user data A to the PRAM 130 without adding metadata. In addition, before writing the user data A to the PRAM 130, the processor 110 may compress the user data A by using a data compression algorithm in order to save storage space of the PRAM 130.

However, it is assumed that the power consumption of the conventional storage device during the operation of writing data is independent of a pattern of the data. The conventional storage device operates under the assumption that the power consumption for writing data to the conventional storage device is independent of the pattern of the data. That is, the processor 110 writes data to the PRAM 130 without considering the pattern ('0' or '1') of the data. Therefore, when data are written to the PRAM 130, power is wasted. Additionally, in the case where the user data A is highly compressed data, the size of the user data A may not be effectively reduced through an additional compression process.

Particularly, in mobile applications, it is very important to reduce power consumption. Therefore, there is a need for reducing power consumption by using the power consumption characteristics of a PRAM when programming the PRAM.

SUMMARY OF THE INVENTION

The present invention provides a method and apparatus for writing data to and reading data from a phase-change random access memory (PRAM) using less power consumption.

According to one aspect, the present invention is directed to a method of writing data to a phase-change random access memory (PRAM), the method including: encoding original data by using a predetermined encoding function; selecting data; from among the original data and the encoded data, which require less power when being written to the PRAM; writing the selected data to the PRAM; generating marking information about the data written to the PRAM; and writing the marking information to the PRAM.

The encoding function may include a function that decreases the number of bits having any one of bit values '0' and '1'.

The encoding function may include an inverting function.

The method may further include receiving the original data from a buffer memory.

The selecting data from among the original data and the encoded data may be performed based on the number of cells of the PRAM that are in an amorphous state if the data are written to the PRAM.

The selecting of the original data or the encoded data may include: calculating power consumption for writing the original data to the PRAM and power consumption for writing the encoded data to the PRAM; comparing the calculation results; and outputting the original data or the encoded data according to the comparison results.

According to another aspect, the present invention is directed to an apparatus for writing data to a phase-change random access memory (PRAM), including: an encoding unit encoding original data using a predetermined encoding function; a data selection unit selecting data, from among the original data and the encoded data, which require less power when being written to the PRAM; a writing unit writing the selected data to the PRAM; and a marking information generation unit generating marking information related to the data written to the PRAM. The writing unit writes the marking information to the PRAM.

In one embodiment, the encoding function comprises a function that decreases the number of bits having one of bit values '0' and '1'.

In one embodiment, the encoding function comprises an inverting function.

In one embodiment, the apparatus further comprises a receiving unit receiving the original data from a buffer memory.

In one embodiment, the data selection unit selects data, from among the original data and the encoded data, based on the number of cells of the PRAM that are in an amorphous state if the data are written to the PRAM.

In one embodiment, the data selection unit comprises: a power consumption calculation unit calculating power consumption for writing the original data to the PRAM and power consumption for writing the encoded data to the PRAM; a comparison unit comparing the calculation results; and an output unit outputting the original data or the encoded data according to the comparison results.

According to another aspect, the present invention is directed to a method of reading data from a PRAM, the method including: reading requested data from the PRAM; reading marking information from the PRAM, wherein the marking information indicates whether the read data are encoded with a predetermined encoding function; determining from the read marking information whether the read data are encoded data; decoding the read data using a predetermined decoding function if the read data are the encoded data; and outputting one of the read data and the decoded data according to whether the read data are the encoded data.

In one embodiment, the decoding function comprises an inverting function.

In one embodiment, the requested data and the marking information are read from the PRAM via a buffer memory.

According to another aspect, the present invention is directed to an apparatus for reading data from a phase-change random access memory (PRAM), including: a reading unit reading requested data and marking information from the PRAM, wherein the marking information indicates whether the read data are encoded with a predetermined encoding function; a determination unit determining whether the read data are encoded data based on the read marking information; a decoding unit decoding the read data using a predetermined decoding function if the read data are the encoded data; and an output unit outputting one of the read data and the decoded data according to whether the read data are encoded data.

In one embodiment, the decoding function comprises an inverting function.

In one embodiment, the requested data and the marking information are read from the PRAM via a buffer memory.

According to another aspect, the present invention is directed to a computer-readable recording medium having a program for executing a method of writing data to a PRAM, the method including: encoding original data using a predetermined encoding function; selecting data, from among the original data and the encoded data, which require less power when being written to the PRAM; writing the selected data to the PRAM; generating marking information related to the data written to the PRAM; and writing the marking information to the PRAM.

According to another aspect, the present invention is directed to a computer-readable recording medium having a program for executing a method of reading data from a PRAM, the method including: reading requested data from the PRAM; reading marking information from the PRAM, wherein the marking information indicates whether the read data are encoded with a predetermined encoding function; determining from the read marking information whether the read data are encoded data; decoding the read data using a predetermined decoding function if the read data are the encoded data; and outputting one of the read data and the decoded data according to whether the read data are encoded data.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which exemplary embodiments of the invention are shown.

Figure 1:
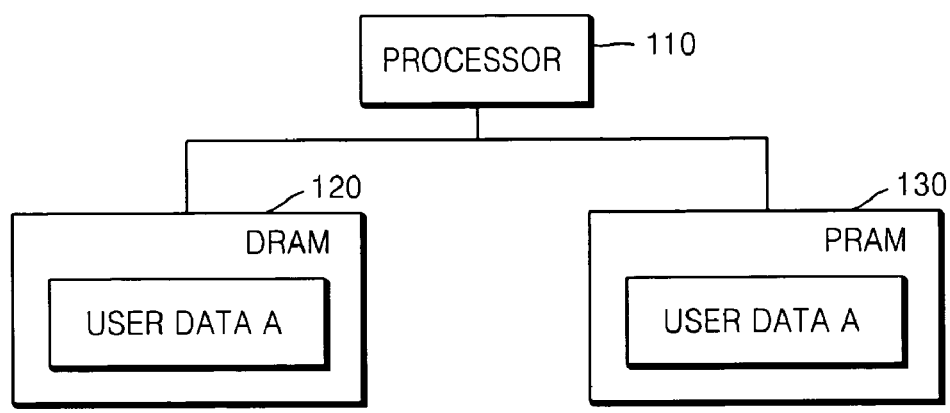
FIG. 1 contains a schematic block diagram of a conventional storage device.
Figure 2:
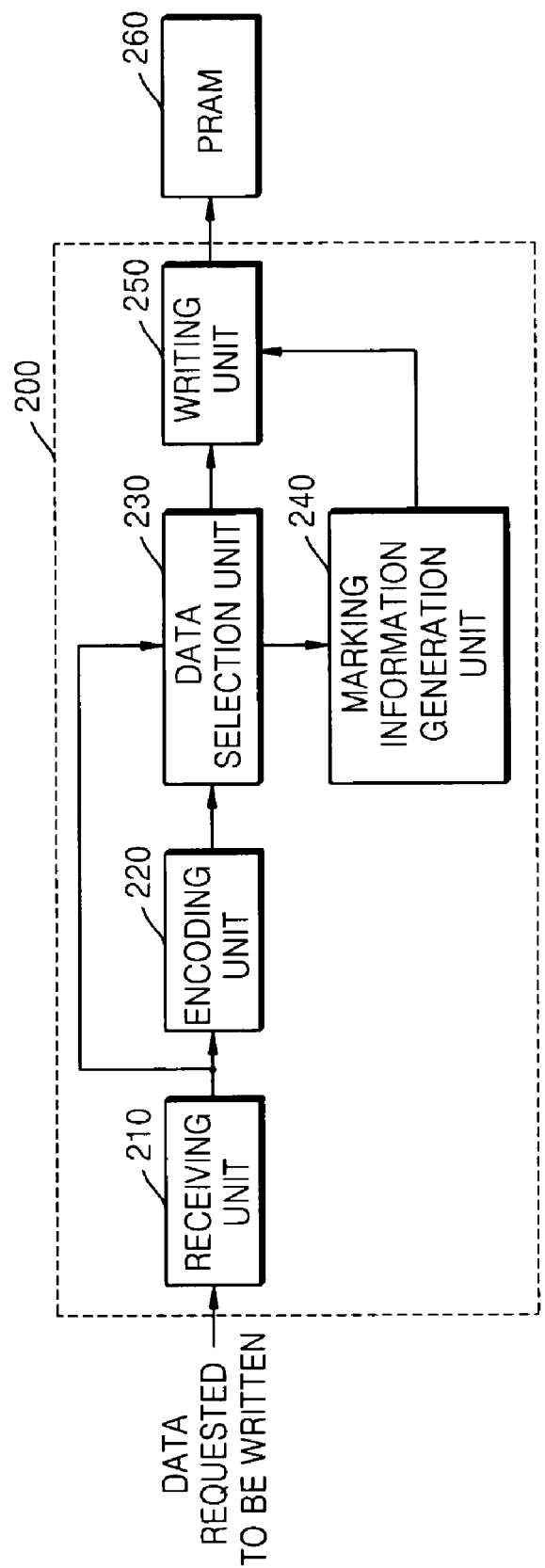
FIG. 2 contains a functional block diagram of an apparatus for writing data to a phase-change random access memory (PRAM), according to an embodiment of the present invention.

FIG. 2 contains a functional block diagram of an apparatus 200 for writing data to a phase-change random access memory (PRAM), according to an embodiment of the present invention. Referring to FIG. 2, the apparatus 200 of the current embodiment includes a receiving unit 210, an encoding unit 220, a data selection unit 230, a marking information generation unit 240, and a writing unit 250. The receiving unit 210 receives user data to be written (i.e., data requested to be written) to the PRAM 260. For example, the receiving unit 210 may receive the user data from a buffer memory (not shown), such as a dynamic random access memory (DRAM). The receiving unit 210 transfers the user data to the encoding unit 220 and the data selection unit 230.

The encoding unit 220 receives the user data from the receiving unit 210 and encodes the received user data using a predetermined encoding function and outputs the encoded data to the data selection unit 230. The encoding function is a function for decreasing the number of bits having one of bit values '0' and '1'.

For example, it is assumed that the power consumption for writing a '1' bit to the PRAM 260 is greater than the power consumption for writing a '0' bit to the PRAM 260. That is, it is assumed that a '1' bit is written by making a cell of the PRAM 260 amorphous, and a '0' bit is written by making a cell of the PRAM 260 crystalline. In this case, the encoding function is configured to decrease the number of '1' bits (i.e., increase the number of '0' bits) included in the received user data from the receiving unit 210. When the number of '1' bits is decreased through the encoding function, power consumption for writing the user data to the PRAM 260 may also be decreased.

An inverting function can be used as the encoding function. However, in the present invention, the encoding function is not limited to a particular kind of function. That is, a variety of other various functions can be used as the encoding function according to embodiments of the present invention.

However, it may occur that the number of '1' bits included in the user data can be increased after the user data is encoded by using the encoding function. In this case, power consumption for writing the user data to the PRAM 260 may increase. To prevent this, the data selection unit 230 can be used as will be described later in more detail. According to another embodiment, the encoding unit 220 can compress user data received from the receiving unit 210 before encoding the user data by using a predetermined encoding function, since the number of '1' bits included in the user data can be decreased after the compression.

The data selection unit 230 receives the user data (i.e., original user data requested to be written) directly from the receiving unit 210 and the encoded user data from the encoding unit 220. The data selection unit 230 selects the original user data or the encoded user data that require less power than the other when being written to the PRAM 260.

For example, the data selection unit 230 can select the original user data or the encoded user data based on the number of amorphous cells (or the number of crystalline cells) of the PRAM 260 after the data are written to the PRAM 260. In detail, the data selection unit 230 counts the number of '1' bits (or '0' bits) of the original user data and the number of '1' bits (or '0' bits) of the encoded user data. Then, the data selection unit 230 compares the count result to select from among the original data and the encoded user data having the smaller number of '1' bits (or the greater number of '0' bits).

According to another embodiment, the data selection unit 230 may include a power consumption calculation unit (not shown), a comparison unit (not shown), and an output unit (not shown). The power consumption calculation unit calculates power consumption for writing original user data to the PRAM 260 and power consumption for writing encoded user data to the PRAM 260. A variety of methods, such as a method of counting data bits having a particular value, can be used to calculate the power consumption. The comparison unit compares calculation results, and the output unit selects the original user data or the encoded data, from among the original user data and the encoded data, which require less power when being written to the PRAM 260, according to the comparison results output from the comparison unit. Then, the output unit outputs the selected data to the writing unit 250.

In addition, the data selection unit 230 provides the writing unit 250 with information about which of the original user data and the encoded user data is selected.

The marking information generation unit 240 receives information about the selected data from the data selection unit 230. Then, the marking information generation unit 240 generates marking information including information about the selected data to be written to the PRAM 260 and provides the generated marking information to the writing unit 250. Although, in the present embodiment, the data selection unit 230 and the marking information generation unit 240 are shown in separate blocks in FIG. 2, the present invention is not limited thereto, and thus, the marking information generation unit 240 can be included in the data selection unit 230 according to another embodiment.

The writing unit 250 receives the selected data from the data selection unit 230, and the marking information related to the selected data from the marking information generation unit 240. Then, the writing unit 250 writes the received data and marking information to the PRAM 260.

Figure 3:
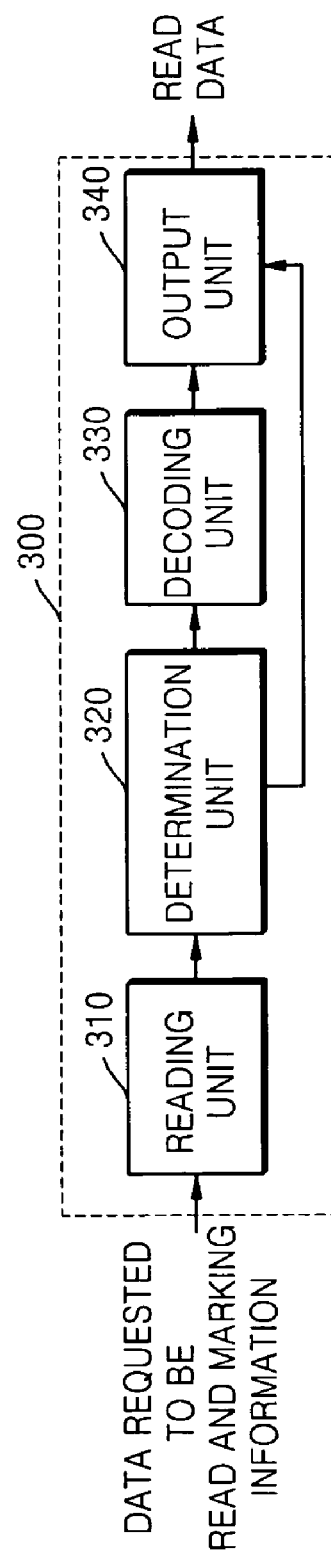
FIG. 3 contains a functional block diagram of an apparatus for reading data from a PRAM, according to an embodiment of the present invention.

FIG. 3 contains a functional block diagram of an apparatus 300 for reading data from a PRAM according to an embodiment of the present invention. Referring to FIG. 3, the apparatus 300 includes a reading unit 310, a determination unit 320, a decoding unit 330, and an output unit 340.

The reading unit 310 reads requested data and marking information about the requested data from a PRAM (not shown). In detail, the requested data and the marking information stored in the PRAM are transferred to and stored in a buffer memory (not shown), such as a DRAM. Thereafter, the data and the marking information are transferred from the buffer memory to the reading unit 310.

The read data can be original user data or user data encoded by a predetermined encoding function. That is, since user data can be stored in the PRAM without encoding or after encoding depending on the amounts of power consumption of the original user data and the encoded user data as described in FIG. 2, the read data can be original user data or encoded user data. Information about whether the read data are encoded data or not encoded data is included in the marking information transmitted to the reading unit 310.

The encoding function used for encoding the user data may be an inverting function. However, in the present invention, the encoding function is not limited to a particular kind of function. That is, a variety of other various functions can be used as the encoding function according to embodiments of the present invention. Since the encoding function has been described above with reference to FIG. 2, a detailed description thereof will not be repeated.

The data and the marking information read by the reading unit 310 is output to the determination unit 320. The determination unit 320 determines, using the received marking information, whether the read data are original user data or encoded user data. If it is determined that the read data are encoded user data, the determination unit 320 transfers the read data to the decoding unit 330. If it is determined that the read data are original user data, the determination unit 320 transfers the read data to the output unit 340.

The decoding unit 330 receives the read data from the determination unit 320. As stated above, the data transferred to the decoding unit 330 are user data encoded with an encoding function.

The decoding unit 330 decodes the received data using a predetermined decoding function. The decoding function is an inverse function ($f^{-1}$) of the encoding function described in connection with FIG. 2. For example, the decoding function may be an inverting function. However, the decoding function is not limited to a particular kind of function, and a variety of other functions may also be used as the decoding function. Due to the decoding of the decoding unit 330, original user data can be obtained from the encoded data stored in the PRAM.

The output unit 340 outputs the decoded data received from the decoding unit 330 or the original user data received from determination unit 320. As a result, all the data output from the output unit 340 are original user data, not encoded data. In another embodiment, when the read data are compressed data, the output unit 330 may decompress the compressed data and then output the decompressed data.

Figure 4:
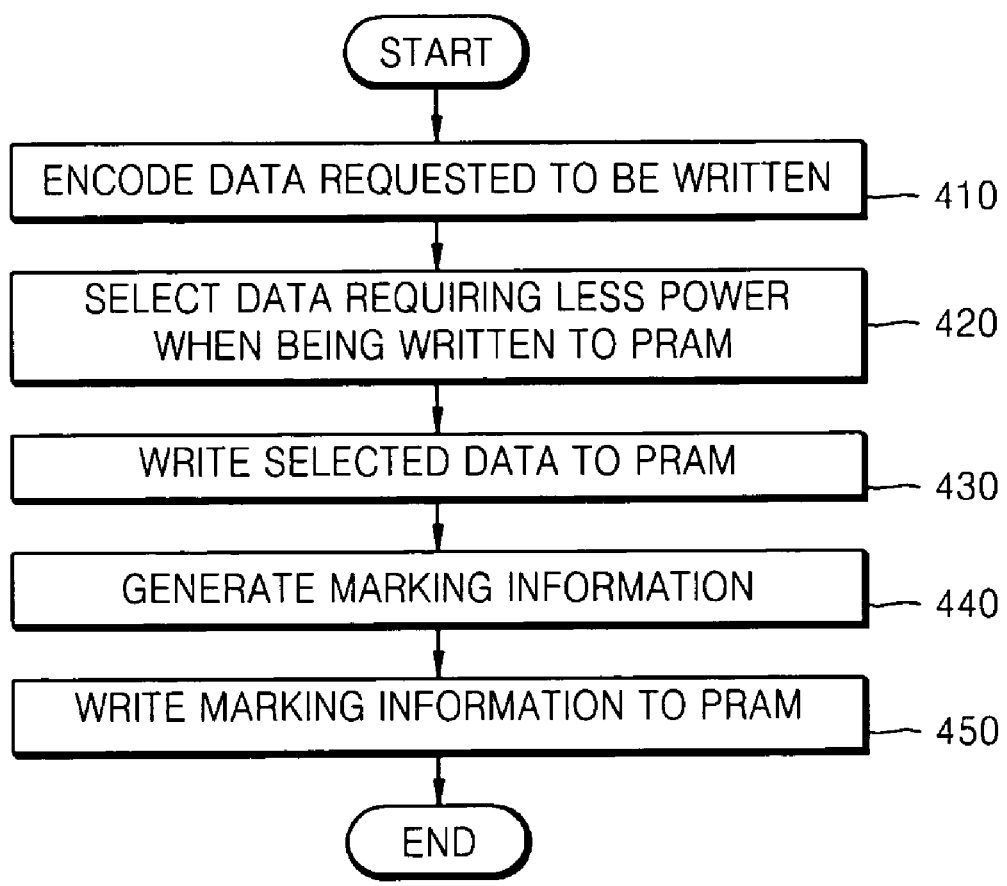
FIG. 4 contains a flowchart of a method of writing data to a PRAM according to an embodiment of the present invention.

FIG. 4 contains a flowchart of a method of writing data to a PRAM, according to an embodiment of the present invention.

Referring to FIG. 4, in operation 410, a data writing apparatus encodes requested original user data using a predetermined encoding function. The user data may be received from a buffer memory. The encoding function is a function for decreasing the number of '1' bits or the number of '0' bits included in the user data. For example, the encoding function may be an inverting function.

In operation 420, the data writing apparatus selects the original user data or the encoded user data, from among the original user data and the encoded user data, that require less power than the other when being written to the PRAM. The selection can be performed based on the number of amorphous cells of the PRAM that will be counted after data are written to the PRAM. In another method, power consumption for writing the original user data to the PRAM and power consumption for writing the encoded user data to the PRAM are calculated, and the calculation results are compared to select the original user data or the encoded user data and output the selected data.

In operation 430, the data writing apparatus writes the original user data or the encoded user data to the PRAM according to the selection result of operation 420.

In operation 440, the data writing apparatus generates marking information including information about which of the original user data and the encoded data is written to the PRAM.

In operation 450, the data writing apparatus writes the marking information generated in operation 440 to the PRAM.

Figure 5:
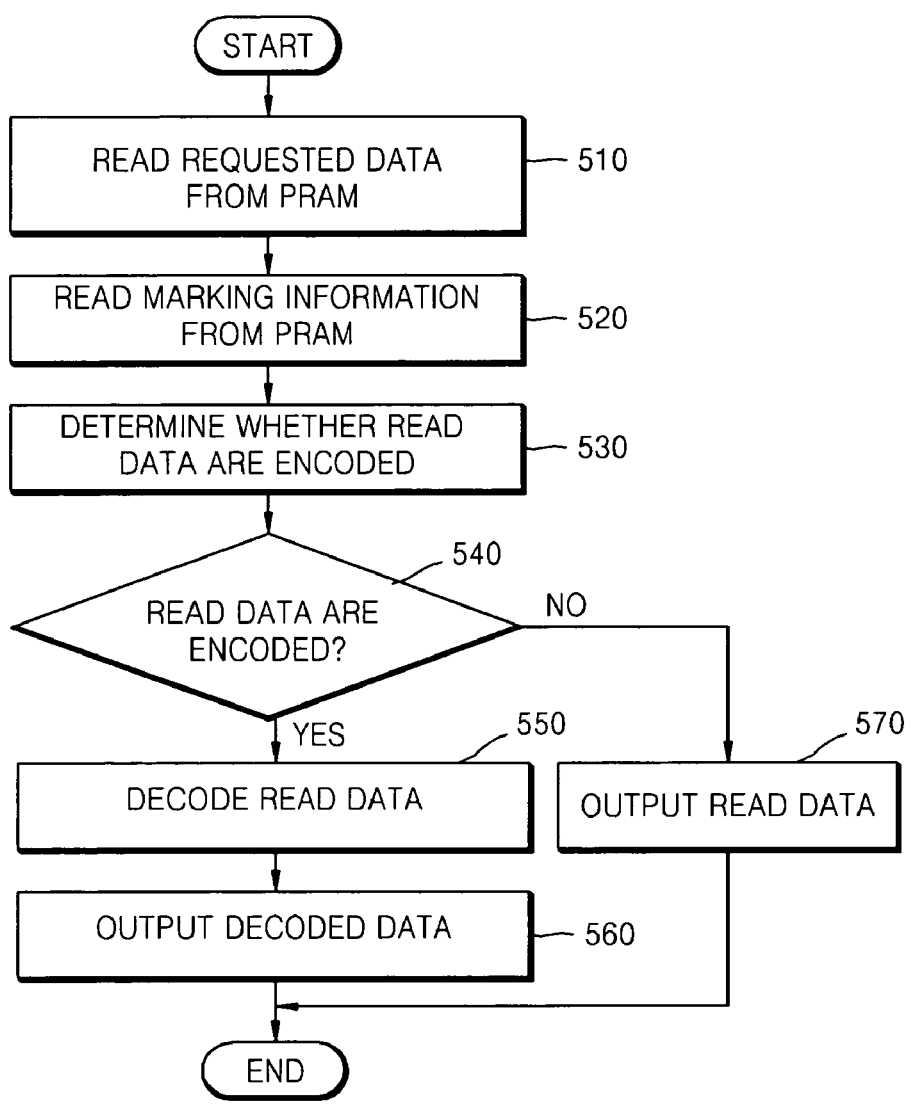
FIG. 5 contains a flowchart of a method of reading data from a PRAM, according to an embodiment of the present invention.

FIG. 5 contains a flowchart of a method of reading data from a PRAM, according to an embodiment of the present invention.

Referring to FIG. 5, in operation 510, a data reading apparatus reads requested data from the PRAM. The requested data may be original user data or encoded data. In detail, the data reading apparatus can read the requested data from the PRAM via a buffer memory.

In operation 520, the data reading apparatus reads marking information including information about whether the read data are original user data or encoded user data.

In operation 530, the data reading apparatus determines whether the read data are encoded data or not encoded data using the marking information read in operation 520.

In operation 540, if it is determined that the read data are encoded data, operation 550 is performed. Otherwise, if it is determined that the read data are original user data, operation 570 is performed.

In operation 550, the data reading apparatus decodes the read data using a predetermined decoding function. For example, the decoding function may be an inverting function. Since the decoding function has been described above with reference to FIG. 3, a detailed description thereof will not be repeated.

In operation 560, the data reading apparatus outputs the decoded data.

In operation 570, if the read data are original user data, the data reading apparatus outputs the read data.

The invention can also be embodied as computer-readable codes on a computer-readable recording medium. The computer-readable recording medium is any data storage device that can store data that can be thereafter read by a computer system.

Examples of the computer-readable recording medium include read-only memory (ROM), random-access memory (RAM), CD-ROMs, magnetic tapes, floppy disks, optical data storage devices, and the like. The computer-readable recording medium can also be distributed over network-coupled computer systems so that the computer-readable code is stored and executed in a distributed fashion.

According to the present invention, data can be encoded using a predetermined encoding function, and thus, save power when writing the data to a PRAM.

In addition, according to the present invention, data can be written to a PRAM with less power so that when the present invention is applied to a mobile device, charging of the battery of the mobile device is less frequently required.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of writing data to a phase-change random access memory (PRAM), the method comprising:
    encoding original data using a predetermined encoding function;
    selecting data, from among the original data and the encoded data, which require less power when being written to the PRAM;
    writing the selected data to the PRAM;
    generating marking information related to the data written to the PRAM; and
    writing the marking information to the PRAM.

2. The method of claim 1, wherein the encoding function comprises a function that decreases the number of bits having one of bit values '0' and '1'.

3. The method of claim 1, wherein the encoding function comprises an inverting function.

4. The method of claim 1, further comprising receiving the original data from a buffer memory.

5. The method of claim 1, wherein selecting data from among the original data and the encoded data is performed based on the number of cells of the PRAM that are in an amorphous state if the data are written to the PRAM.

6. The method of claim 1, wherein selecting of the original data or the encoded data comprises:
    calculating power consumption for writing the original data to the PRAM and power consumption for writing the encoded data to the PRAM;
    comparing the calculation results; and
    outputting the original data or the encoded data according to the comparison results.

7. An apparatus for writing data to a phase-change random access memory (PRAM), comprising:
    an encoding unit encoding original data using a predetermined encoding function;
    a data selection unit selecting data, from among the original data and the encoded data, which require less power when being written to the PRAM;
    a writing unit writing the selected data to the PRAM; and
    a marking information generation unit generating marking information related to the data written to the PRAM,
    wherein the writing unit writes the marking information to the PRAM.

8. The apparatus of claim 7, wherein the encoding function comprises a function that decreases the number of bits having one of bit values '0' and '1'.

9. The apparatus of claim 7, wherein the encoding function comprises an inverting function.

10. The apparatus of claim 7, further comprising a receiving unit receiving the original data from a buffer memory.

11. The apparatus of claim 7, wherein the data selection unit selects data, from among the original data and the encoded data, based on the number of cells of the PRAM that are in an amorphous state if the data are written to the PRAM.

12. The apparatus of claim 7, wherein the data selection unit comprises:
    a power consumption calculation unit calculating power consumption for writing the original data to the PRAM and power consumption for writing the encoded data to the PRAM;
    a comparison unit comparing the calculation results; and
    an output unit outputting the original data or the encoded data according to the comparison results.

13. A method of reading data from a PRAM, the method comprising:
    reading requested data from the PRAM;
    reading marking information from the PRAM, wherein the marking information indicates whether the read data are encoded with a predetermined encoding function;

determining from the read marking information whether the read data are encoded data;

decoding the read data using a predetermined decoding function if the read data are the encoded data; and outputting one of the read data and the decoded data according to whether the read data are the encoded data.

14. The method of claim 13, wherein the decoding function comprises an inverting function.

15. The method of claim 13, wherein the requested data and the marking information are read from the PRAM via a buffer memory.

16. An apparatus for reading data from a phase-change random access memory (PRAM), comprising:

a reading unit reading requested data and marking information from the PRAM, wherein the marking information indicates whether the read data are encoded with a predetermined encoding function;

a determination unit determining whether the read data are encoded data based on the read marking information;

a decoding unit decoding the read data using a predetermined decoding function if the read data are the encoded data; and an output unit outputting one of the read data and the decoded data according to whether the read data are encoded data or not.

17. The apparatus of claim 16, wherein the decoding function comprises an inverting function.

18. The apparatus of claim 16, wherein the requested data and the marking information are read from the PRAM via a buffer memory.

19. A computer-readable recording medium having a program for executing a method of writing data to a PRAM, the method comprising:

encoding original data using a predetermined encoding function;

selecting data, from among the original data and the encoded data, which require less power when being written to the PRAM;

writing the selected data to the PRAM;

generating marking information related to the data written to the PRAM; and writing the marking information to the PRAM.

20. A computer-readable recording medium having a program for executing a method of reading data from a PRAM, the method comprising:

reading requested data from the PRAM;

reading marking information from the PRAM, wherein the marking information indicates whether the read data are encoded with a predetermined encoding function;

determining from the read marking information whether the read data are encoded data;

decoding the read data using a predetermined decoding function if the read data are the encoded data; and outputting one of the read data and the decoded data according to whether the read data are encoded data.

* * * * *